United States Patent [19]
Easton et al.

[11] Patent Number: 5,507,085
[45] Date of Patent: Apr. 16, 1996

[54] METHOD AND APPARATUS FOR AUTOMATICALLY PLACING LIDS ON COMPONENT PACKAGES

[75] Inventors: Keith M. Easton; Cedric Kentzler, both of Plano; Richard W. Simpson, Jr., Sherman, all of Tex.

[73] Assignee: Cybex Technologies Corp., Richardson, Tex.

[21] Appl. No.: 65,294

[22] Filed: May 13, 1993

[51] Int. Cl.⁶ .................................................. B23P 21/00
[52] U.S. Cl. .......................... 29/407.04; 29/430; 29/783; 29/784; 29/787; 29/809; 29/822; 29/407.01; 53/53; 53/72
[58] Field of Search ............................ 29/407, 430, 773, 29/783, 784, 785, 787, 791, 799, 809, 822–824; 53/53, 67, 72, 75, 76, 485; 198/345.1–345.3, 346.1

[56] References Cited

U.S. PATENT DOCUMENTS

| | | | |
|---|---|---|---|
| 4,787,141 | 11/1988 | Miyazaki et al. | 29/784 X |
| 4,896,418 | 1/1990 | Yearsley | 29/720 X |
| 5,205,026 | 4/1993 | Sticht | 29/33 P |
| 5,271,490 | 12/1993 | Sticht | 29/784 X |

FOREIGN PATENT DOCUMENTS

| | | | |
|---|---|---|---|
| 3-112200 | 5/1981 | Japan . | |
| 1-188240 | 7/1989 | Japan | 29/784 |
| 1-295746 | 11/1989 | Japan . | |
| 2-256430 | 10/1990 | Japan | 29/720 |
| 2-292138 | 12/1990 | Japan . | |
| 6-45794 | 2/1994 | Japan | 29/720 |

OTHER PUBLICATIONS

"LDP-3000, Lid Placement Machine, Hardware/Maintenance Manual", Cybex Technologies Corp, Richardson, Texas.
"Equipment Overview, LDP-1000", Cybex Technologies Corp., Richardson, Texas.

*Primary Examiner*—S. Thomas Hughes
*Attorney, Agent, or Firm*—David H. Judson

[57] ABSTRACT

Apparatus for automatically placing a lid on a component package and then securing the lid with a clip. The apparatus includes a programmable robot arm having a gripping assembly, an inspection station, a first conveyor for conveying a boat along a path between a first position and a second position, a pick arm for removing a first lid from a lid feeder station, a second conveyor for reciprocating the pick arm between first and second positions to thereby transfer the first lid from the lid feeder station to the inspection station, and a camera located at the inspection station for inspecting the first lid. The apparatus further includes a rotary actuator arm and a mechanism for reciprocating the rotary actuator arm into contact with a first lid bottom surface following inspection of the first lid and for releasing the pick arm. A control program selectively controls the robot arm (i) to move the gripper assembly to the clip feeder station and to pick up a first clip during inspection of the first lid, (ii) to move the gripper assembly along with the first clip to the inspection station and to pick up the first lid following inspection of the first lid, and (iii) to move the gripper assembly along with the first clip and the first lid from the inspection station to a predetermined assembly position located along the path.

25 Claims, 10 Drawing Sheets

METHOD AND APPARATUS FOR AUTOMATICALLY PLACING LIDS ON COMPONENT PACKAGES

TECHNICAL FIELD

The present invention relates generally to computer-aided methods and systems for manufacturing products in a high volume, automated continuous process and more particularly to improved methods and apparatus for automatically placing lids on component packages.

BACKGROUND OF THE INVENTION

Integrated circuit devices are well-known in the prior art. Such devices or so-called "dies" are normally designed to be supported or carried in a hermetically-sealed "package" having a plurality of pins or leads. The package serves as a carrier and as a heat sink and is normally square or rectangular in shape. It includes a cavity in which the integrated circuit die is placed. After the integrated circuit is secured in the cavity of the package, typically a component "lid" is placed over an exposed surface of the circuit. A bottom surface of the lid includes a "pre-form" material such as epoxy or solder that is used to secure the lid over the circuit to provide a protective cover. The pre-form is cured by placing the package in a furnace.

During such manufacture, it has also been known to secure the component lid against the integrated circuit die to prevent movement of the lid during curing of the pre-form. This is typically accomplished through the use of a pressure clip that is latched onto the package. After curing, the clip is removed. Throughout one or more steps in the process, the integrity of the die and the placement of the lid on the die are evaluated to determine whether a correct package assembly exists. A correct package assembly is said to exist when the lid is properly aligned. If the assembly satisfies these conditions, the package is accepted. If a correct package assembly is not found to exist, the package is rejected.

While such processing steps are known in the art, there have been several problems associated with such manufacturing methods and systems. It has been difficult to place and secure the package lid on the integrated circuit die and then inspect the lid in an accurate and consistent manner so as to facilitate a high volume, continuous manufacture of component packages. As noted above, if a correct package assembly is not achieved, a significant investment in the costly integrated circuit device may be lost. Accurate placement and inspection of the lid on the die is thus critical to providing acceptable results.

To overcome the problems associated with the prior art, it has been known to use manual or semi-automatic machines to place the lids on component packages. Such machines have been marketed by the Cybex Technologies Corp., the assignee of the present application, under Model Nos. LDP-150 (manual) and LDP-1000 (semi-automatic). While such machines have proven especially useful in enhancing the accuracy and reliability of the lid placement, these machines do not enable lids to be applied during the actual flow into the furnace and they cannot provide production efficiencies capable of supporting large volume operations.

Therefore, there remains a long-felt need in the semiconductor industry to provide for improved methods and apparatus for manufacturing integrated circuit component packages in a high volume, cost-efficient and reliable manner while simultaneously decreasing the percentage of packages rejected due to improper lid placement or other defects during such processing.

BRIEF SUMMARY OF THE INVENTION

It is a primary object of the present invention to provide computer-controlled methods and apparatus for automating the production of component packages in a high volume, continuous process.

It is another object of the invention to provide an automated lid placement apparatus that is used in-line with other production machines, such as a furnace, to facilitate formation of component packages during a continuous process flow through a production facility.

It is yet another object of the invention to describe methods and systems for accurately and reliably placing lids on component packages in a reliable, cost-effective manner.

It is still another object of the invention to provide methods and apparatus for continuous production of component packages in a production line while significantly reducing the percentage of non-acceptable packages caused by lid placement defects.

It is another general object of the invention to provide an automated lid placement apparatus which includes a programmable robot arm and a cooperating vision inspection system. The programmable robot arm includes a gripper assembly for automatically placing a lid on a component package and then securing the lid with a clip.

Yet another object of the invention is to provide multiple inspections of the package lid prior to, during and after placement of the lid on the component package. By inspecting the lid prior to its placement on the die, lids having pre-form defects can be rejected prior to attempted sealing of the die.

It is still another object of the invention to facilitate the uninterrupted processing of component packages in the manner heretofore described using a lid feeder station and a clip feeder station that make multiple lids and clips available to the programmable robot arm in a continuous manner. Such assemblies cooperate to significantly enhance the throughput of the processing line.

It is a further object of the invention to provide an apparatus for placing lids on component packages wherein the packages are supported on boats that are conveyed along a path through a predetermined assembly position. A boat preferably includes a body portion and at least one side rail having a plurality of spaced openings therein. The apparatus includes an indexing mechanism that functions to place each component package in the predetermined assembly position.

According to the more specific aspects of the present invention, a method is provided for automatically placing a lid on a component package and then securing the lid with a clip, wherein at least one component package is supported on a boat that is conveyed along a path. The method begins by removing a lid from a lid feeder station and then transferring the lid from the lid feeder station to an inspection station. Thereafter, the lid is inspected to evaluate its integrity and the integrity of any lid pre-form. During inspection of the lid, a clip is picked up from a clip feeder station. The clip is then transferred to the inspection station following inspection of the lid. According to the method, the boat is then indexed to place a component package in a predetermined assembly position along the path. The lid and the clip are then transferred from the inspection station to the predetermined assembly position. To complete the process, the lid is placed on the component package and the clip is secured to the boat in an overlapping manner. The clip retains the lid against the integrated circuit die supported in the component package.

In a preferred embodiment of the invention, an apparatus for automatically placing a lid on an electronic component package according to the above-described method comprises a programmable robot arm having a gripping assembly, a lid feeder station, an inspection station, a clip feeder station and an assembly station. The assembly station is located along a conveyor that conveys a boat along a path between a first position and a second position. The lid feeder station has a pick arm for removing a first lid from a lid feeder station, and a conveyor for reciprocating the pick arm between first and second positions to thereby transfer the first lid from the lid feeder station to the inspection station. The inspection station includes a number of components including a camera for inspecting the lid to evaluate lid integrity and to determine the orientation of the lid with respect to a predetermined axis, a rotary actuator arm, and a mechanism for reciprocating the rotary actuator arm into contact with a lid bottom surface following inspection of the lid and for releasing the pick arm. The apparatus has a control mechanism including a digital signal processor and associated program routines that selectively control the robot arm (i) to move the gripper assembly to the clip feeder station and to pick up a first clip during inspection of the first lid, (ii) to move the gripper assembly along with the first clip to the inspection station and to pick up the first lid following inspection of the first lid, and (iii) to move the gripper assembly along with the first clip and the first lid from the inspection station to a predetermined assembly position located along the path.

The control routines also function to return the gripper arm of the lid feeder station to its first position following transfer of the lid to the rotary actuator arm at the inspection station. When the pick arm returns to its first position, it is controlled to pick up a second lid. Following the movement of the gripper assembly of the robot arm from the inspection station to the predetermined assembly position in connection with the first lid and clip, the pick arm is again reciprocated between its first and second positions to thereby transfer the second lid from the lid feeder station to the inspection station. The second lid is then inspected at the inspection station, the gripper assembly of the robot arm is then reciprocated back to the clip feeder station to pick up a second clip, and the boat is indexed to place the next component package of the boat in the predetermined assembly position along the path. The process continues in this manner.

To enhance processing throughput, the lid feeder station advantageously supports a plurality of lids in multiple stacks on a rotatable carousel, and the clip feeder station supports a plurality of clips in multiple trays. As the lids are exhausted from each stack in the carousel, the carousel rotates to present a new stack to the gripper arm of the lid feeder station. When all stacks of the carousel are exhausted, the carousel is rotated away from the pick arm and a new carousel provided. Likewise, as the clips are exhausted from a tray, another tray is placed into position to feed the gripping assembly of the robot arm.

The foregoing has outlined some of the more pertinent objects of the present invention. These objects should be construed to be merely illustrative of some of the more prominent features and applications of the invention. Many other beneficial results can be attained by applying the disclosed invention in a different manner or modifying the invention as will be described. Accordingly, other objects and a fuller understanding of the invention may be had by referring to the following Detailed Description of the preferred embodiment.

BRIEF DESCRIPTION OF THE DRAWINGS

For a more complete understanding of the present invention and the advantages thereof, reference should be made to the following Detailed Description taken in connection with the accompanying drawings in which.

Similar reference characters refer to similar parts throughout the several views of the drawings.

DETAILED DESCRIPTION

The inventive method and apparatus will now be described in conjunction with the continuous placement of lids on component packages. It should be appreciated that the use of the invention for this purpose should be considered merely exemplary and that the techniques and mechanisms described can be used whenever it is desired to accurately position and retain any piece in place over another component supported in a movable boat. Thus, for example, the invention is useful in manufacturing multichip modules wherein multiple dies are supported in each component package cavity and a single large lid is placed over the cavity. Other applications of the invention include the manufacture of dies and components for pacemakers.

Figure 1A:
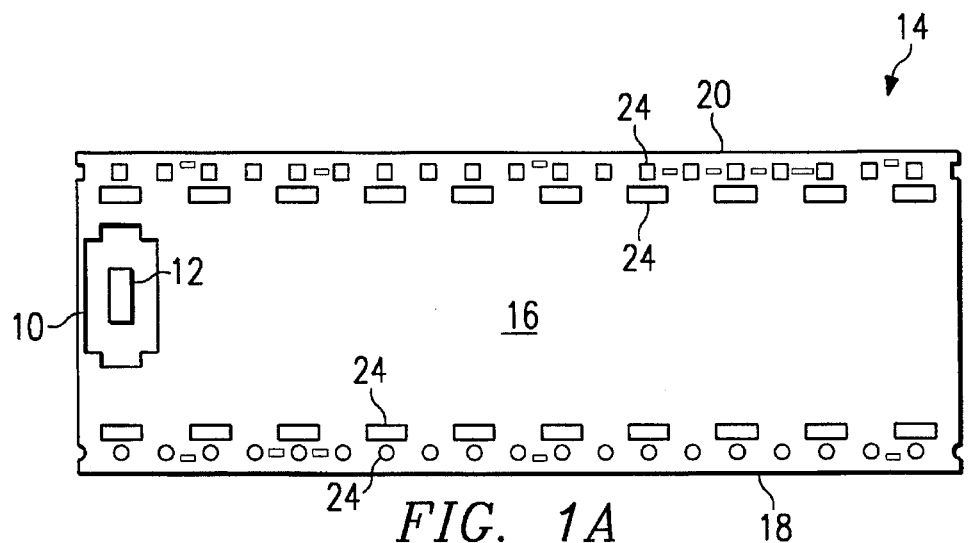
FIGS. 1A–1B are side views of exemplary boats for use in supporting a plurality of component packages through the automated lid placement apparatus of the present invention.
Figure 1B:
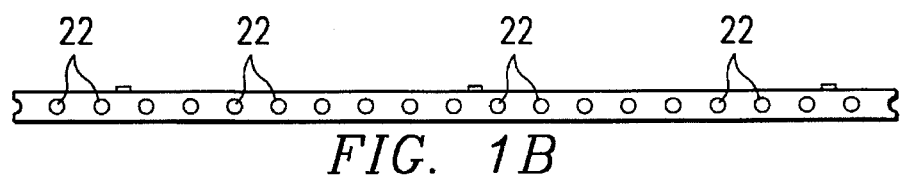
Figure 1C:
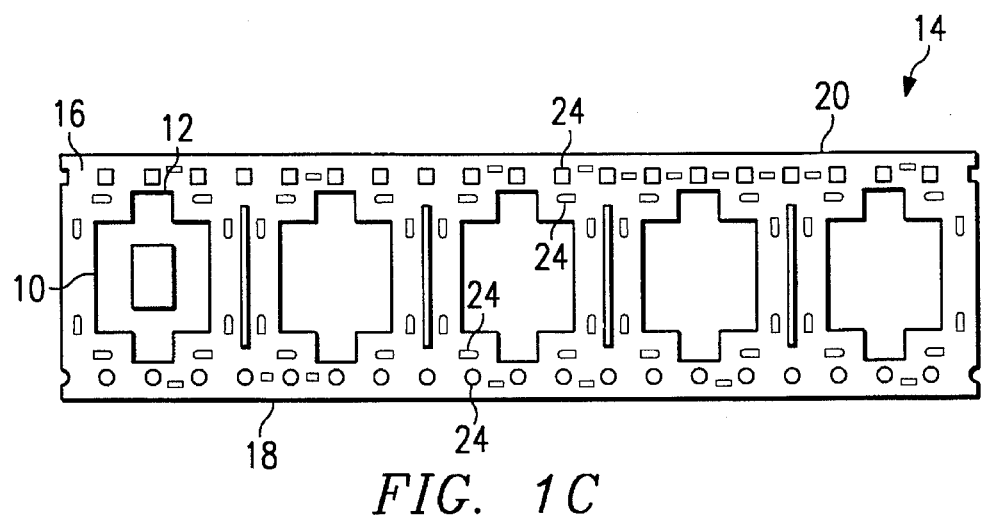
Figure 1D:
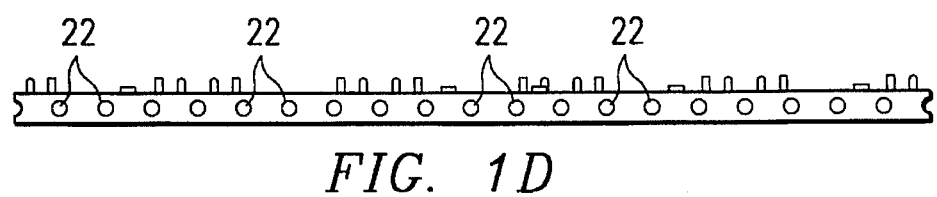
Figure 2A:
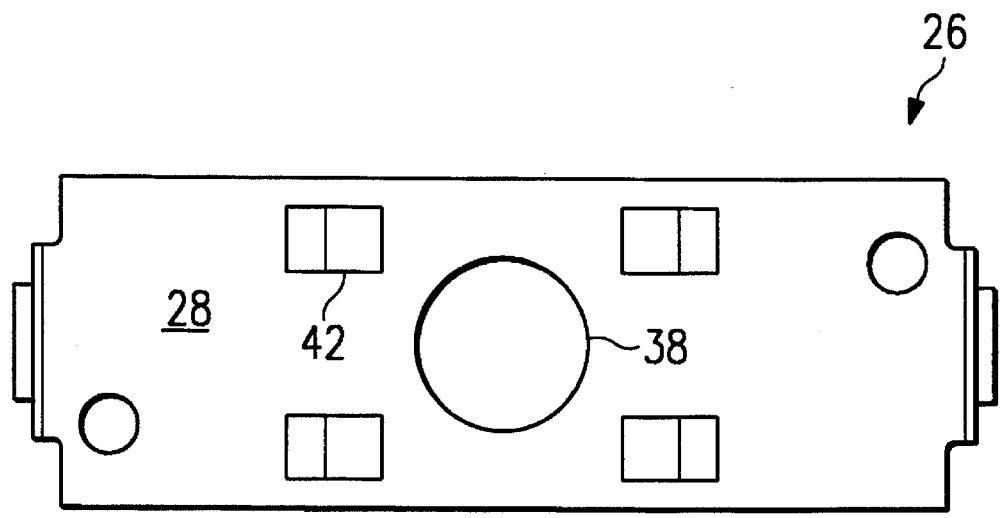
FIG. 2A is a plan view of a preferred clip structure for use in securing a lid to the integrated circuit die during manufacture of a component package according to the invention.
Figure 2B:
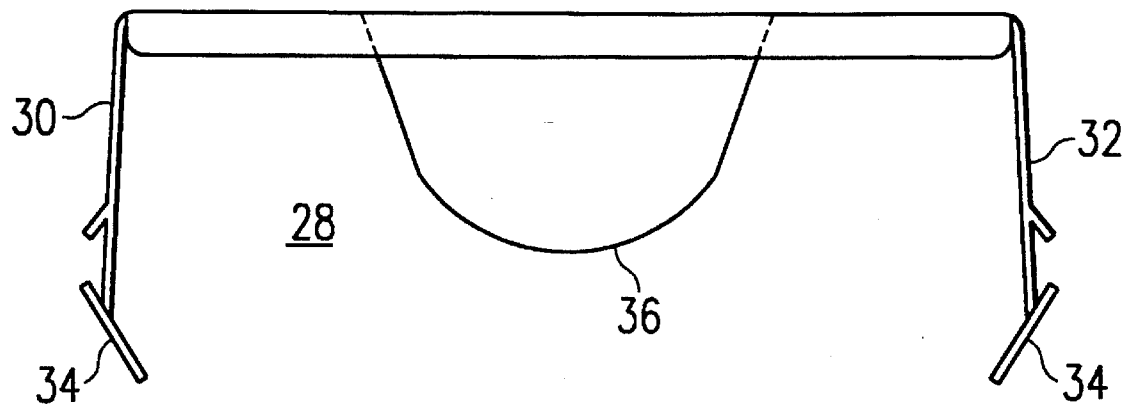
FIG. 2B is a side view of the preferred clip structure illustrated in FIG. 2A.

In the exemplary embodiment, a method and apparatus are provided for automatically placing a lid on an electronic component package to facilitate the formation of a hermetically-sealed device. As described generally above, each lid is placed over an integrated circuit die supported in the package and then secured therein using a clip. As seen in FIGS. 1A–1B, which are side views, each component package 10 has at least one die 12 and is supported in an opening in a "boat" 14. The boat 14 includes a body portion 16 and a pair of side rails 18 and 20. Each of the side rails 18 and 20 preferably includes a plurality of spaced positioning holes 22 therein for purposes to be described. Each boat 14 supports a number of component packages. For example, the boat illustrated in FIG. 1A supports ten (10) component packages while the boat shown in FIG. 1B supports five (5) packages. Each opening in the boat includes a pair of locking slots 24. With reference now to FIGS. 2A–2B, each clip 26 preferably comprises a body 28 and a pair of arms 30 and 32 extending downwardly from ends of the body 28. Each arm 30 and 32 includes a locking flange 34 adapted to be received in one of the locking slots 24 of the boat. The clip 26 further includes a spring member 36. After the lid is placed over the die, the clip is brought into alignment over the package and the arms 30 and 32 pushed into the associated locking slots 24. The locking flange 34 on each arm is retained against the underside of the body portion 16 to retain the clip. The spring member 36 presses against the lid to prevent it form moving relative to the die.

The clip 26 also includes a central opening 38 through the body 28. An opening 40 in the spring member 36 is aligned therewith. A plurality of slots 42 are provided in the clip body 28 adjacent the central opening 38 for the purposes to be described. Although the structure of the clip 26 in FIG. 2 is preferred, such structure is not to be taken by way of limitation. For example, the spring member 36 may be replaced with a coil spring or the like.

According to the invention, an automated lid placement apparatus includes a general purpose computer control system for controlling the operation of the apparatus. The control system includes one or more work stations having a 486-based processor having associated storage, appropriate operating system and control programs, and suitable I/O devices (such as a keyboard, mouse, display and printer). The apparatus further advantageously uses a robot arm that is controlled by a special purpose computer control system. Although not meant to be limiting, preferably the robot is a 4-axis selectively-compliant articulated robot arm (SCARA) which is commercially available from Adept Technology, Incorporated located in San Jose, Calif. The robot arm is controlled by associated control software routines that effect sequential movements of the robot arm in accordance with the processing steps to be described.

Figure 3A:
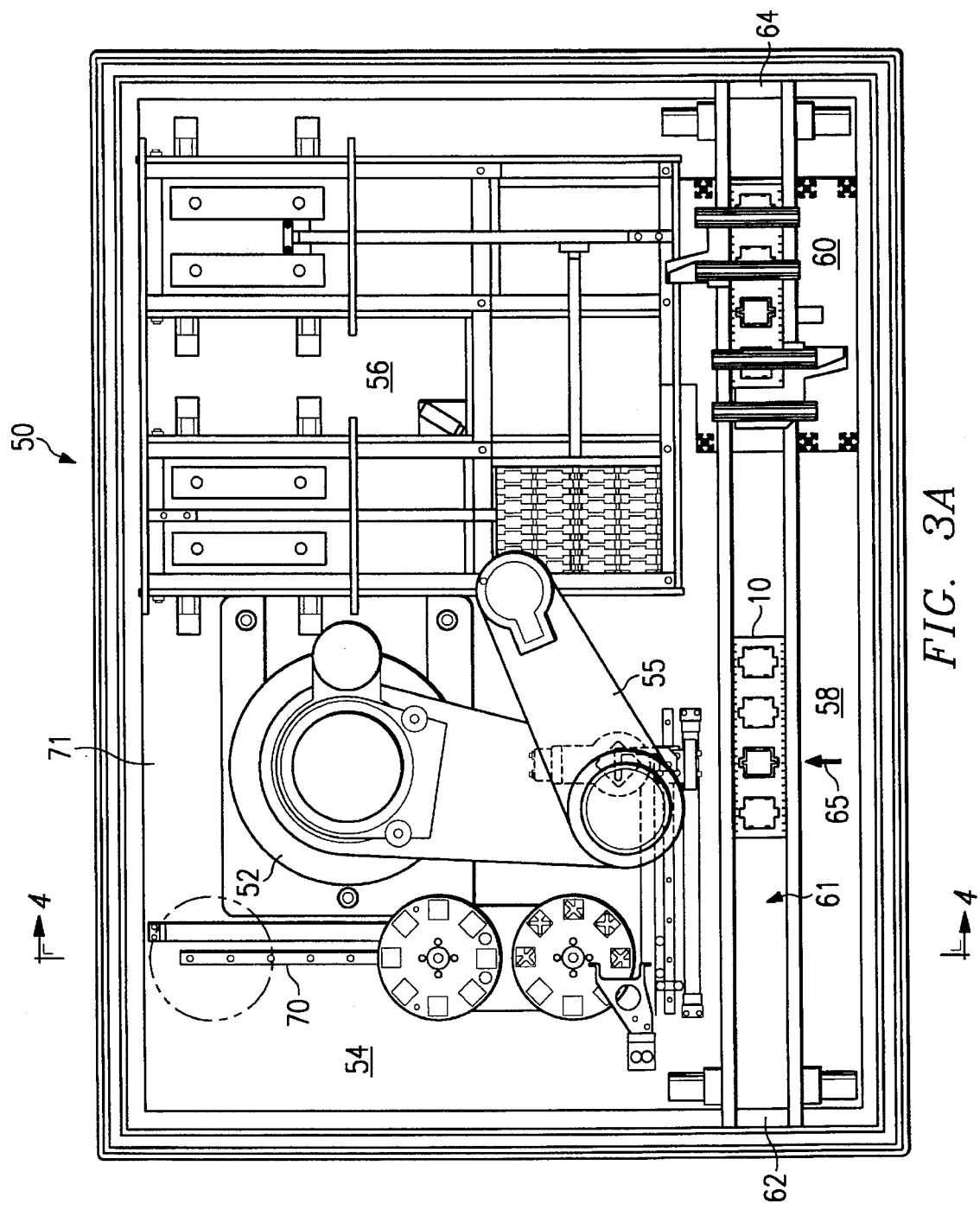
FIGS. 3A–3C show the relative positions of the programmable robot arm during its three primary operating positions according to the method of the invention.

Referring now to FIG. 3A, which illustrates an apparatus 50 of the present invention. Apparatus 50 preferably includes a number of cooperating functional components or assemblies. The apparatus 50 automatically places a lid on a component package supported in a boat as shown in FIGS. 1A–1B and retains the lid against the package using the clip shown in FIGS. 2A–2B. The apparatus 50 comprises the programmable robot arm 52, a lid feeder station 54, an inspection station 55, a clip feeder station 56, an assembly station 58 and a post-assembly inspection station 60. The assembly station 58 is located along an edge-belt conveyor 61 that conveys a boat 10 along a linear path between a first position, corresponding to inlet 62, and a second position, corresponding to outlet 64. Assembly station 58 includes a predetermined assembly position, indicated by the arrow 65, at which the lid and clip are assembled onto the integrated circuit die as will be described.

Figure 3B:
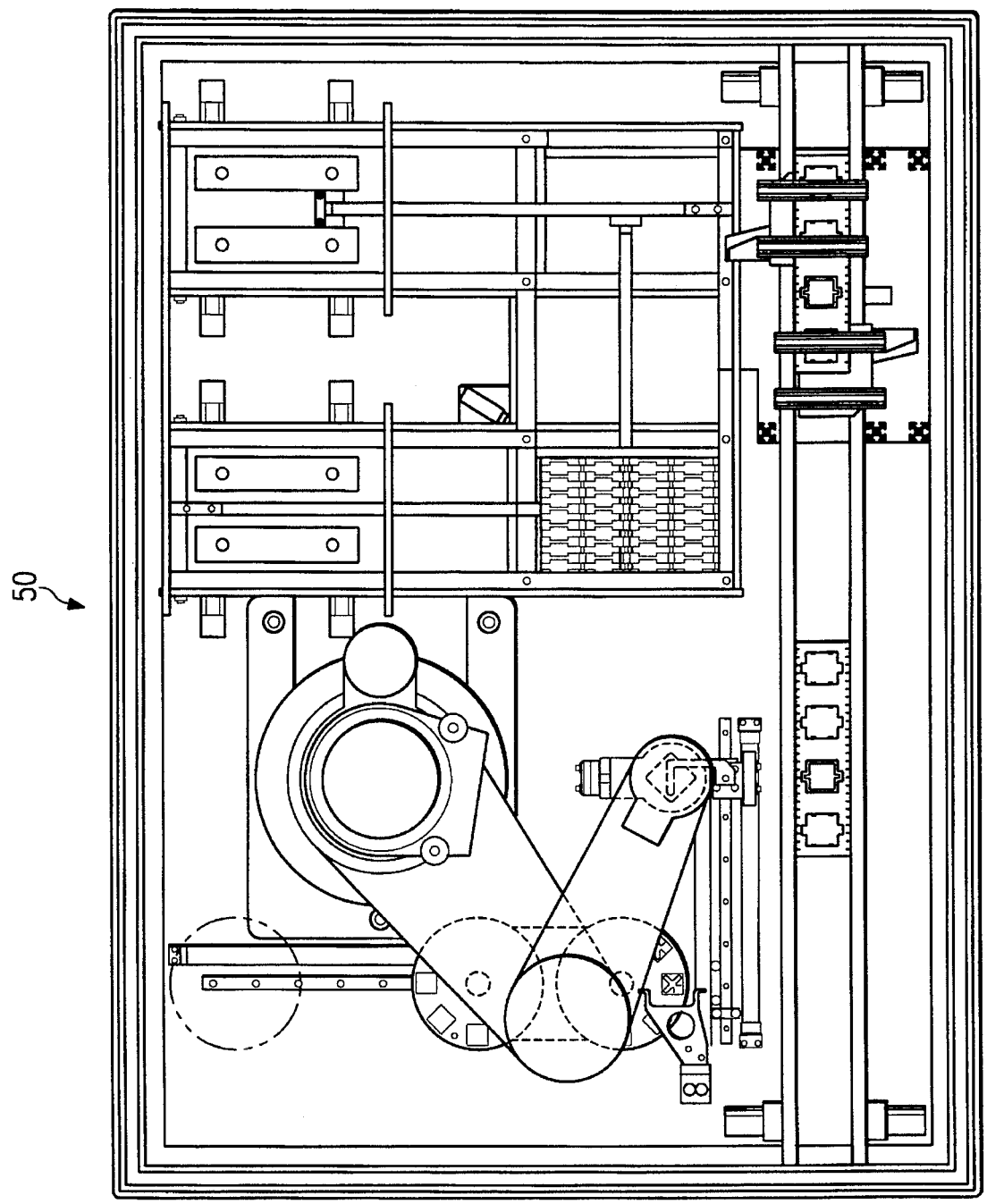
Figure 3C:
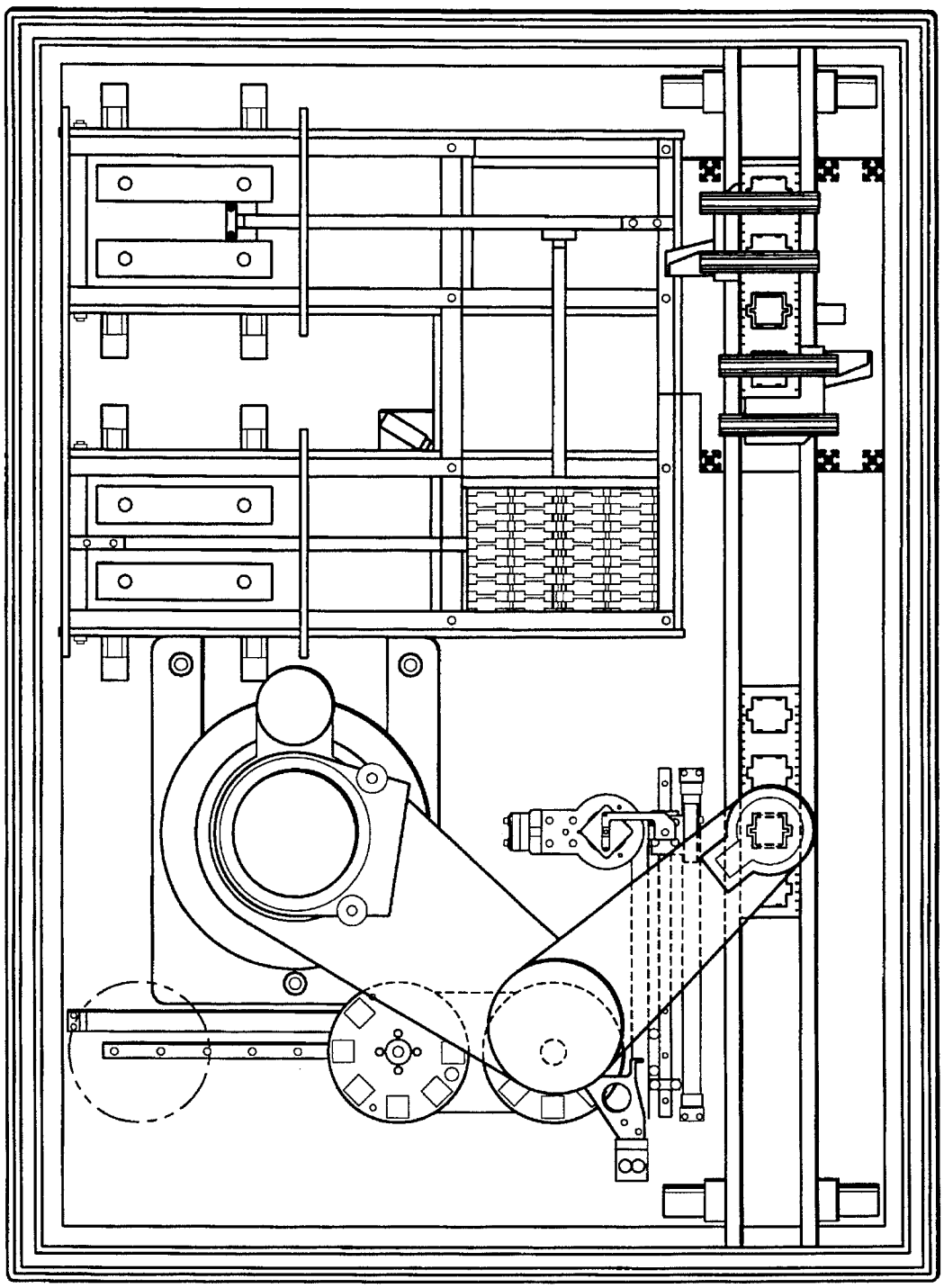

It should be appreciated that each boat enters the apparatus at the inlet 62 and then travels along the path through the assembly station 58 where the lids are applied. After the lids are placed on all packages on the boat, the boat is moved through the inspection station 60 wherein the lid placement for each package is evaluated. Thereafter, the boat is conveyed through the outlet 64. Although not shown in detail, it is desired that a plurality of boats, each supporting a number of die packages (four (4) packages as shown in FIGS. 3A–3C), are continuously supplied to the edge-belt conveyor 61. In particular, a new boat is supplied at the inlet after all packages in a previous boat (located at the assembly station 58) have been indexed through the predetermined assembly position. The lids are then supplied to the packages in the new boat as the previous boat is processed through the inspection station 60. Appropriate sensor and indexing assemblies are located at the inlet 62 and outlet 64 of the conveyor 61 to control the movement of boats thereon. Conveyors, such as those manufactured by Flexible Technology located in Richardson, Texas, are suitable for use in the present invention. The conveyor is controlled by a suitable electric motor and gearing mechanism as is well-known in the art.

Figure 10:
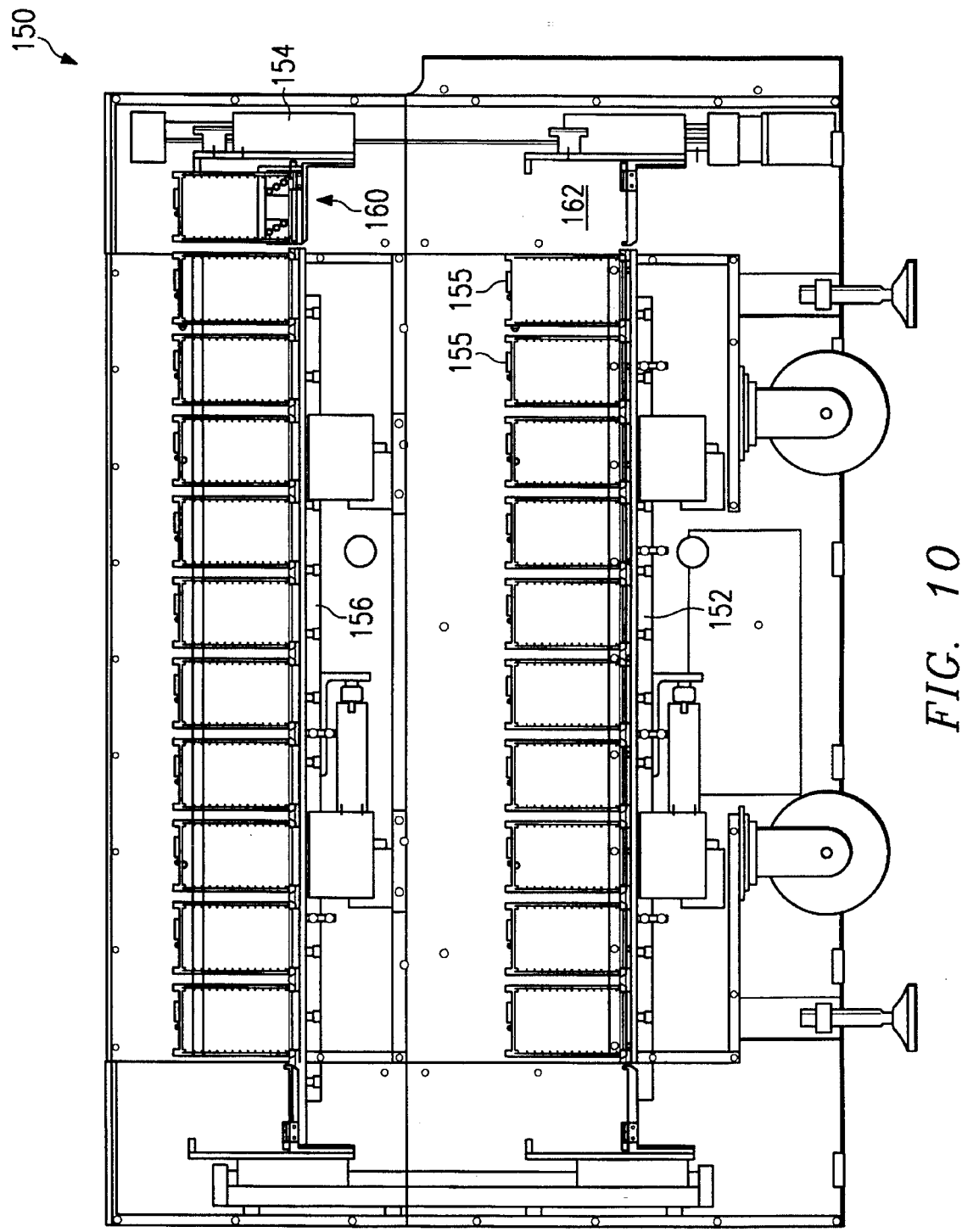
FIG. 10 is an elevation view of a walking-beam mechanism for supporting boats in a plurality of circulating magazines.

On the inlet side of the apparatus 50, boats are preferably supported in one or more circulating magazines as will be described in more detail below with respect to FIG. 10. Each magazine is positioned into proximity with a walking-beam as shown in FIG. 10 and then raised or lowered such that the boats therein are continuously placed onto the conveyor 61. On the outlet side of the apparatus, the conveyor passes through an inspection station 60 and then links up with a discharge mechanism, such as a walking-beam, a flu (furnace load/unload) or an elevator. The discharge mechanism is selectively-controlled to discharge any boat 10 that has been found by the inspection station 60 to include an incorrect component assembly. If a flu is used as the discharge mechanism, a recirculating conveyor or robot functions to transfer the boats from the conveyor 61 into a furnace. Thus, it can be seen that the conveyor 61 feeds the discharge mechanism directly such that lid placement and sealing of the packages is effected in-line through the process flow. It is thus not required to remove the packages at any time from the process flow unless and until a defect in one of the packages is found.

The basic operating method of the automatic lid placement apparatus can now be described with reference to FIGS. 3A–3C. Generally, the method begins by obtaining a lid at the lid feeder station 54 and then transferring the lid to the inspection station 55. Thereafter, the lid is inspected to evaluate its integrity and the integrity of any lid pre-form for scratches or any defects. This evaluation is performed by a camera in the inspection station 55 which is preferably located underneath a support surface 71 of the apparatus. During inspection of the lid, the robot arm 52 is driven over to the clip feeder station 56 in order to obtain a clip. This is the position of the robot arm shown in FIG. 3A. The clip is then transferred to the inspection station following inspection of the lid. This is the position of the robot arm shown in FIG. 3B. According to the method, the boat 10 is then indexed to place a component package in the predetermined assembly position (arrow 65) along the path. The lid and the clip are then transferred from the inspection station to the predetermined assembly position. This is the position of the robot arm shown in FIG. 3C. When the robot arm is in the position shown in FIG. 3B, another lid is obtained from the lid feeder station. As the robot arm moves from the position in FIG. 3B to the position shown in FIG. 3C, this new lid is brought over to the inspection station 55 and inspected. During such inspection, the robot arm goes over to the clip feeder station 56 to pick up another clip (FIG. 3A), and the process repeats.

According to the invention, continuous processing of the component packages is achieved in part by using the lid feeder station 54 and the clip feeder station 56 to support a large number of lids and clips, respectively. The lids are supported in stacks on one or more rotatable carousels of the lid feeder station 54, and the clips are supported in one or more movable trays of the clip feeder station 56. As the lids are exhausted from each stack in the carousel, the carousel rotates to present a new stack for processing. When all stacks of the carousel are exhausted, the empty carousel is replaced with a new carousel.

Figure 4:
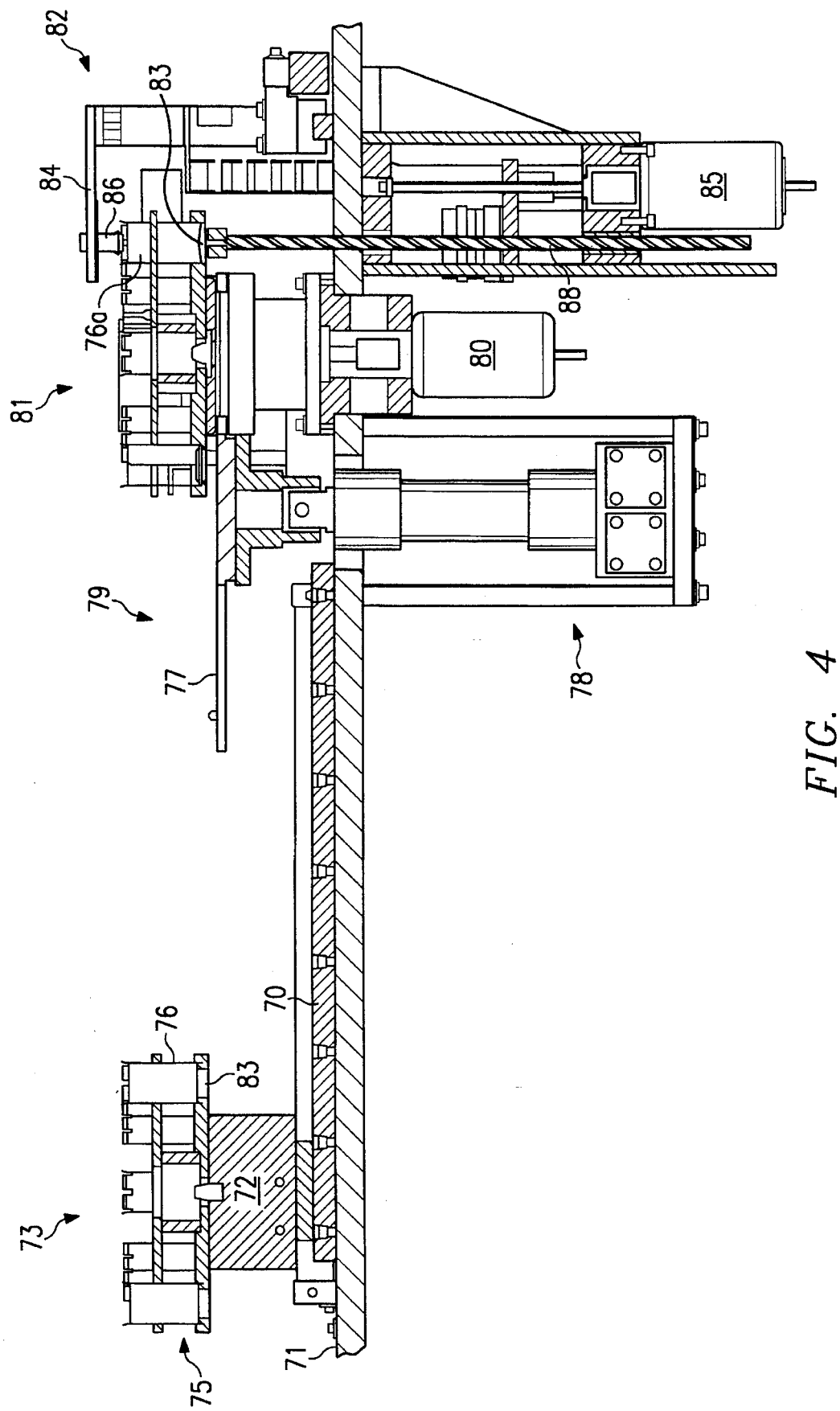
FIG. 4 is an elevation view of the lid feeder station taken along lines 4-4' of FIG. 3A.
Figure 5:
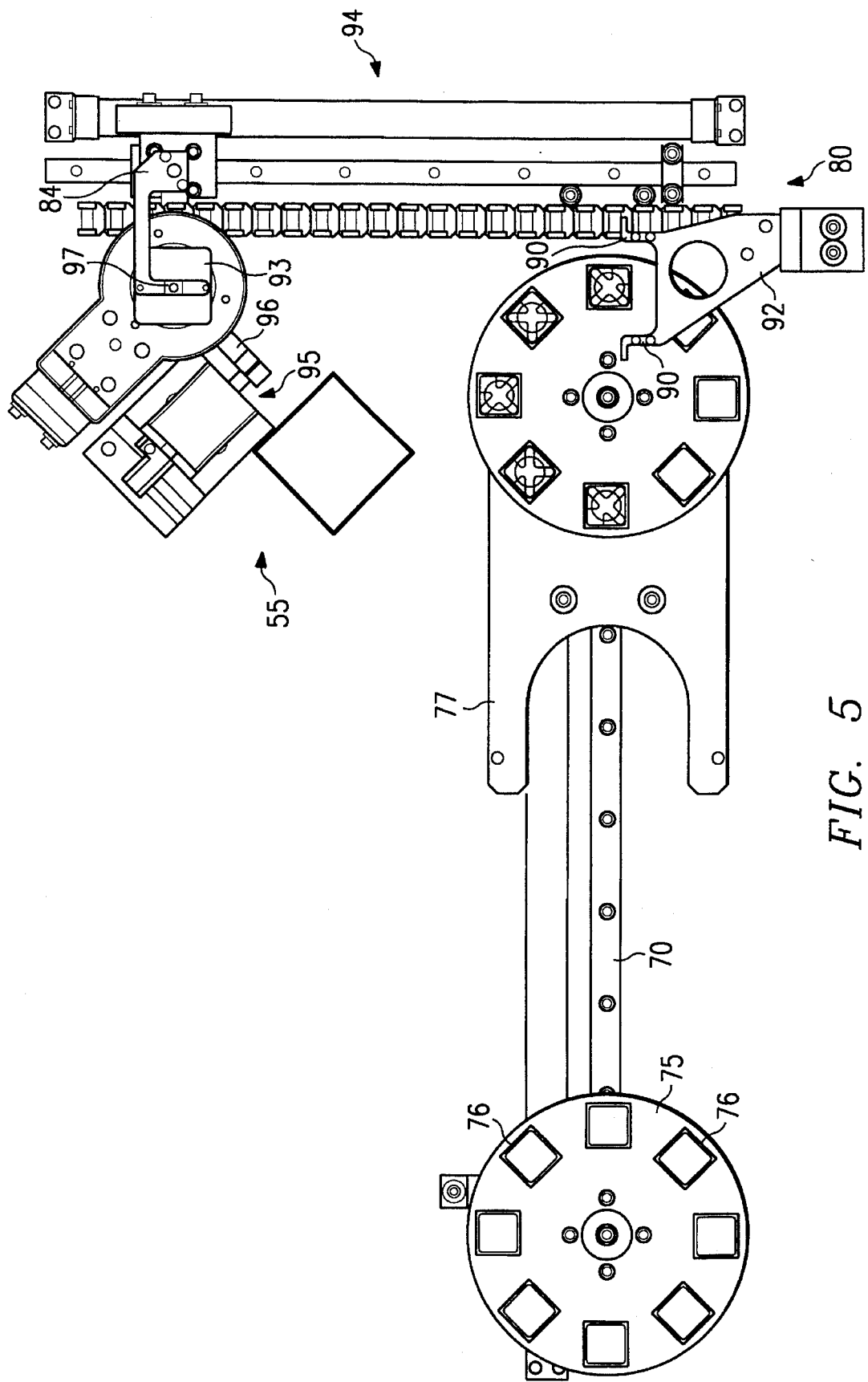
FIG. 5 is a plan view of the lid feeder station of FIG. 4 and the inspection station of the apparatus.

Referring now to FIG. 4, a detailed elevation view is shown of the lid feeder station taken along lines 4–4' of FIG. 3A. FIG. 5 shows a plan view of the lid feeder station of FIG. 4 along with the inspection station 55. The following description is best understood by considering FIGS. 4 and 5 together.

The lid feeder station 54 includes a guide track 70 supported on the surface 71. A shuttle 72 supports a carousel 75 in which a plurality of lids are supported in one or more cartridges 76. As seen in FIG. 5, the cartridges 76 are preferably spaced about the diameter of the carousel 75, and the carousel includes a plurality of spaced openings 83. Each opening 83 underlies one of the cartridges for the purposes to be described. The shuttle 72 is adapted to reciprocate on the guide track 70 between a first position 73, at one end of the track, and a transfer position 79, wherein the carousel 75 is received in a transfer member 77 of a 180 degree rotary actuator 78. The rotary actuator 78 functions to rotate the transfer member 77 (along with the carousel) 180 degrees and thus transfer the carousel (which is filled with cartridges) into an unloading position designated generally by the reference numeral 81. Of course, as a new carousel is placed into the unloading position, any carousel that was in such position previously is then placed into the transfer position 79, from which it is then shuttled back to the first position 73 and refilled.

The lid feeder station 82 further includes a stepper motor 80 for rotating the carousel at the unloading position to selectively place each cartridge 76 of the carousel in cooperating relation to a lid feeder station 82. The lid feeder station 82 functions to obtain a lid from a cartridge 76 and then transfer the lid to the inspection station 55. This is achieved as follows. As seen in FIG. 4, the lid feeder station 82 includes a pick arm 84 having a suction cup 86 at an end thereof. The suction cup 86 overlies a cartridge 76a that is positioned by selectively actuating the stepper motor 80. Another stepper motor 85 is provided to drive a pushrod 88 through the opening 83 in the carousel to selectively raise one of the lids into engagement with the suction cup 86.

As best seen in FIG. 5, the lid feeder station 82 includes a through-beam sensor 90 supported in a bracket 92. Through-beam sensor 90 functions to identify whether all of the lids in a given cartridge have been used or if a lid is in position to be picked up by the pick arm 84. If so, the stepper motor 80 is controlled to rotate the carousel to bring the next cartridge 76 into alignment underneath the lid feeder station 82. As noted above, once all cartridges in the carousel have been emptied, the rotary actuator 78 is driven to rotate a new carousel into the unloading position 81. The empty carousel is then shuttled back to the first position for reloading.

Referring again to FIG. 5, a conveyor 94, such as a rodless air cylinder, is provided for reciprocating the pick arm 84 (and the lid retained by the suction cup 86 thereof) between first and second positions to thereby transfer the lid from the lid feeder station 82 to the inspection station 55. According to the present invention, the inspection station 55 includes a camera underlying the support surface 71 for inspecting the lid integrity as discussed above. For example, a pre-form 93, shown by a dotted line in FIG. 5 thereby indicating it is located on the lid bottom surface, is inspected. During inspection of the lid at the inspection station 55, as previously described the robot arm is moved to the clip feeder station 56 to obtain a clip 26 (see FIG. 3A). The inspection station 55 also includes a rotary actuator 95 having an arm 96. Rotary actuator 95 is adapted to reciprocate the arm 96 into contact with the lid bottom surface following inspection of the lid pre-form. As the arm 96 is swung into position under the lid, the suction cup 86 is released such that the lid is transferred from the pick arm 84 to the rotary actuator arm 96. At this point the pick arm 84 is reciprocated on the conveyor 94 back to its first position to obtain another lid.

Figure 6:
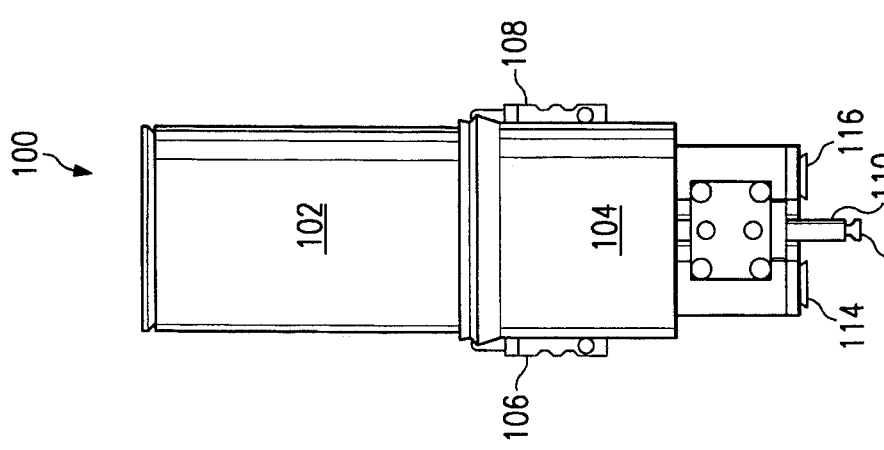
FIG. 6 is an elevation of the preferred gripper assembly of the robot arm.

Meanwhile, the robot arm has already picked up a clip 26 as generally described above. With reference now to FIG. 6, a detailed elevation is shown of a preferred construction of a gripper assembly 100 for use in carrying out this function. The gripper assembly 100 includes a mount 102 adapted to be attached to an end of the programmable robot arm. The gripper assembly 100 further includes a gripping head 104 secured to the mount 102 through a pair of releasable latches 106 and 108. Latches 106 and 108 are released to facilitate repair of the head or replacement thereof. Preferably, the gripping assembly 100 includes one or more different heads such that differently-sized clips can be used. The latches provide a quick-change interface to enable the gripping assembly head to be easily changed. The gripping assembly supports a plurality of vacuum assemblies. In particular, gripping head 104 supports a central stem 110, the end of which includes a vacuum cup 112 connected to one vacuum assembly. The head further includes a pair of vacuums cups 114 and 116 connected to another vacuum assembly. The head is operably connected to a vacuum pump (not shown), and the various assemblies are selectively controlled to draw or release the vacuum as necessary. Central stem 110 is designed to pass through openings 38 and 40 of the clip 26 as described in FIG. 2 such that the vacuum cup 112 can be used to retain a lid (after the gripper assembly is moved back over to the inspection station as will be described).

Figure 7:
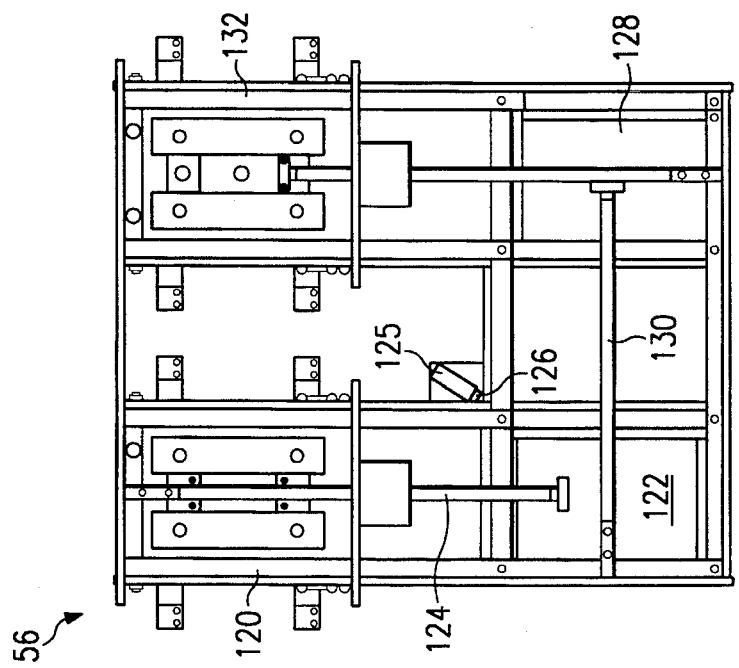
FIG. 7 is a plan view of a preferred construction of the clip feeder station of the present invention.

The vacuum cups 114 and 116 of the gripper head are used to pick up a clip when the gripper assembly 100 is brought over to the clip feeder station 56 by the programmable robot arm (as shown in FIG. 3A). Referring now to FIG. 7, the clip feeder station 56 is shown in plan view and includes four distinct areas. As discussed above, according to the invention the clips are supported in trays. The clip feeder station 52 includes an input tray stacker 120 which receives a plurality of clip-loaded trays in a stacked manner. One by one, and starting with the bottom-most tray, each loaded tray supported in the input tray stacker is shuttled over to a clip tray presentation area 122 by a shuttle 124. A cylinder 125 having a pushrod 126 is used to retain the tray in the presentation area. Each clip in the tray supported in the presentation area is then sequentially unloaded by the gripper assembly using the vacuum cups 114 and 116. After all clips in a tray have been exhausted, the empty tray is reciprocated from the presentation area 122 to a transfer position 128 by a shuttle 130. A next tray is then shuttled from the input tray stacker 120 to the presentation area 122 so that continuous processing is achieved. The empty tray is eventually moved back into an output tray stacker 132 which supports the empty trays in a stacked fashion.

Thus, the clips are supported in a plurality of stacked trays and the trays are unloaded from the input tray stacker and transferred one-by-one to the presentation area. Empty trays are loaded into the output tray stacker and retained until it is necessary to refill the input tray stacker.

With reference to the above-described drawings, the preferred operation of the apparatus can now be described in more specific detail. The apparatus is used to automatically place a lid on a component package and then to secure the lid with a clip. In operation, a first boat 10 is conveyed along the conveyor 61 between the inlet 62 and the outlet 64. As the first boat 10 is being conveyed, the pick arm 84 of the lid feeder station 82 is controlled to remove a first lid from a lid feeder station 82. The pick arm is then reciprocated on the conveyor 94 between first and second positions to thereby transfer the first lid from the lid feeder station to the inspection station 55. At the inspection station, the first lid is inspected to evaluate the integrity of the lid and to determine the orientation of the first lid with respect to a predetermined axis (identified by reference numeral 97 in FIG. 5). During inspection of the first lid at the inspection station 55, the gripper assembly 100 of the robot arm is moved to the clip feeder station 56 (as shown in FIG. 3A). Prior to such movement, a tray has been placed into the presentation area 122 of the clip feeder station as previously described. The vacuum assembly in the gripper head 104 is actuated to cause the vacuum cups 114 and 116 to pick-up a first clip from the tray located in the presentation area. When the first clip is picked up, the central stem 110 passes through the clip openings 38 and 40.

Following inspection of the first lid by the inspection station, the arm 96 is swung into position by the rotary actuator 95 to contact the first lid bottom surface. The pick arm 84 is simultaneously released to transfer the first lid to the rotary actuator arm, where it is retained. The pick arm 84 is then returned to its first position by the conveyor 94 and a second lid is moved up into contact with the suction cup 86 through actuation of the stepper motor 85 and pushrod 88. As noted above, if the sensor 90 indicates that no more lids are present in the cartridge being unloaded, the stepper motor 80 is actuated to rotate a new cartridge into position underneath the pick arm 84.

After the transfer of the first lid, the gripper assembly 100 of the robot arm along with the first clip is then moved to a predetermined position at the inspection station in order to pick up the first lid. This is the position of the robot arm shown in FIG. 3B. The predetermined position is determined by the orientation of the first lid, which in the preferred embodiment is determined by a camera mounted above the inspection station 55. Once the gripping assembly 100 is brought back over the lid (which is being retained from below by the arm 96), the vacuum assembly in the head 104 is again actuated to cause the vacuum cup 112 to contact the lid upper surface and retain the first lid along with the first clip.

Thereafter, the component package having the surface to be covered is indexed into the predetermined assembly position 65. The rotary actuator arm 96 of the inspection station transfer mechanism is then released. The gripper assembly 100 of the robot arm along with the first clip and the first lid are then transferred from the inspection station 55 to the assembly station 58. This is the position of the robot arm shown in FIG. 3C. The gripper assembly 100 is next reciprocated in a downward direction to a predetermined point and the vacuum cups 112, 114 and 116 are then released to place the first lid on the first component package while simultaneously securing the first clip to the boat. In particular, when the gripping assembly 100 is moved by the robot arm in a downward direction, the pair of arms 30 and 32 of the clip are received in the locking slots 24 of the boat and the flanges 34 retain the clip against movement. The spring member 36 of the clip rests against the lid and prevents the lid from moving relative to the package.

After the robot arm has been moved to the position shown in FIG. 3C in order to deposit the first clip and first lid onto the component package, the pick arm 84 is again reciprocated on the conveyor 94 between the first and second positions to thereby transfer the second lid from the lid feeder station to the inspection station. The method then recycles by inspecting the second lid at the inspection station, moving the robot arm to the clip feeder station to pick up a second clip (during inspection of the second lid), indexing the boat to place another component package in the predetermined assembly position, etc.

Figure 8:
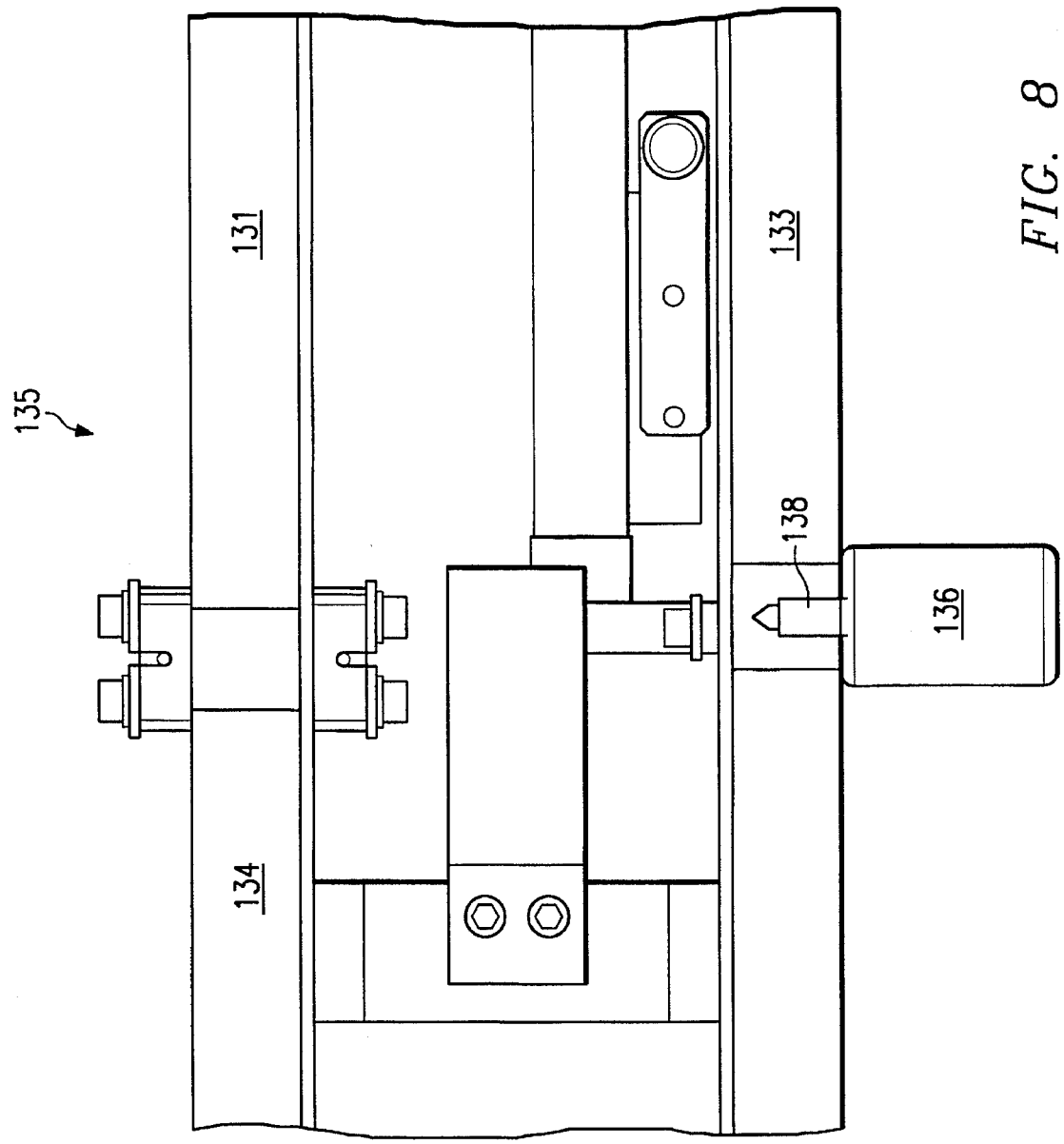
FIG. 8 is a plan view of the various components of an indexing mechanism for use in accurately positioning the boat in the assembly station of the apparatus.

According to the invention, preferably the boat is indexed through the assembly station 58 using the indexing mechanism shown in FIG. 8. As noted above in FIG. 1, each boat 14 includes a body portion 16 and a pair of side rails 18 and 20. Each of the side rails 18 and 20 preferably includes a plurality of spaced positioning holes 22. As seen in FIG. 8, the indexing mechanism 135 includes a through-beam sensor 134 mounted on one rail 131 of the conveyor 61 and a locking mechanism 136 supported on the opposite rail 133. The through-beam sensor includes an LED and phototransistor for counting the number of spaced positioning holes 22 in the side rail of the boat. When a predetermined number of the holes 22 have been counted, the locking mechanism 136 is actuated to drive a plunger 138 thereof into one of the positioning holes 22 to lock the boat into position. As long as the number of holes and their relative spacing is known, it is thus possible to use the indexing mechanism to control the selective movement of the boat through the assembly station regardless of the size of the boat or the number of packages therein.

Figure 9:
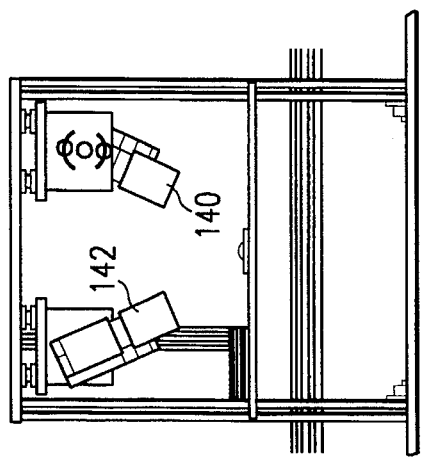
FIG. 9 is an elevation view of a post-assembly inspection station.

According to the invention, there are also provided one or more cameras to facilitate the package formation. The overhead camera is preferably used to inspect the component package in the predetermined assembly position to locate a lid placement position after movement of the gripper assembly of the robot arm from the clip feeder station to the inspection station. The gripper assembly is then aligned at the assembly station based on the location of the lid placement position. With reference now to FIG. 9, an elevation view is shown of the preferred structure of the post-assembly inspection station 60. This station includes a pair of cameras 140 and 142 which are supported above the conveyor 61 and are designed to inspect opposite corners of the placed lid. These cameras check to determine whether the lid has been properly placed. If a correct package assembly is not achieved, the boat is discharged from the process line prior to reaching the furnace. CCD cameras are suitable for use in accordance with the present invention and are commercially available from Panasonic.

Turning now to FIG. 10, an elevation view is shown of a walking-beam assembly for supporting boats in a plurality of circulating magazines 155. This assembly is adapted to be supported adjacent the inlet 62 of the conveyor 61 to facilitate continuous processing of the boats. The assembly 150 comprises a first walking-beam 152, an elevator 154 and a second walking-beam 156. Each magazine 155 supports preferably ten (10) boats. As each magazine reaches a transfer position 160, it is eventually transferred downward on the elevator 154 to an unloading position 162 where individual boats are unloaded onto the conveyor 61. After all boats are unloaded from a magazine, the empty magazine is transferred along walking-beam 152.

Although not shown in detail, it should be appreciated that the various control mechanisms of the apparatus are selectively controlled by suitable actuators under the control of software programs resident in the control processor. Such control mechanisms are well known in the art.

It should be appreciated by those skilled in the art that the specific embodiments disclosed above may be readily utilized as a basis for modifying or designing other structures for carrying out the same purposes of the present invention. Certain aspects of the present invention are suitable for use in die manufacture. For example, it may be desirable to use the clip to retain a lid over a die in testing for "known good die". In such case, the boat may be used to support a number of dies being indexed through a test fixture during such tests. The gripper assembly may be used to obtain a particular die from a storage medium and to invert the die to facilitate testing. In such an apparatus, a programmable robot arm is used (i) to move the gripper assembly to the clip feeder station and to pick up a first clip, (ii) to move the gripper assembly along with the first clip and to pick up a first lid, (iii) to move the gripper assembly, the first clip and the first lid and to pick up a first die, and (iv) to move the gripper assembly along with the first clip, the first lid and the first die to a predetermined assembly position. It should also be realized by those skilled in the art that such equivalent constructions do not depart from the spirit and scope of the invention as set forth in the appended claims.

What is claimed is:

1. A method, using a programmable robot arm having a gripping assembly for automatically placing a lid on a component package and then securing the lid with a clip, each of the lids having a pre-form on one side thereof and wherein at least one component package is supported on a boat, comprising the steps of:

(a) conveying a first boat along a path between a first position and a second position;

(b) removing a first lid from a lid feeder station using a pick arm;

(c) reciprocating the pick arm between first and second positions to thereby transfer the first lid from the lid feeder station to an inspection station;

(d) inspecting the first lid to evaluate the integrity of the first lid and to determine the orientation of the first lid with respect to a predetermined axis;

(e) during inspection of the first lid at the inspection station, moving the gripper assembly of the robot arm to a clip feeder station and picking up a first clip;

(f) following inspection of the first lid, reciprocating a rotary actuator arm into contact with the first lid bottom surface and releasing the gripper arm;

(g) returning the pick arm to its first position and removing a second lid from the lid feeder station using the pick arm;

(h) moving the gripper assembly of the robot arm along with the first clip to a predetermined position at the inspection station and picking up the first lid, wherein the predetermined position is determined by the orientation of the first lid;

(i) indexing the first boat to place a first component package in a predetermined assembly position along the path;

(j) releasing the rotary actuator arm and moving the gripper assembly of the robot arm along with the first clip and the first lid from the inspection station to the predetermined assembly position; and (k) placing the first lid on the first component package and securing the first clip to the boat in an overlapping manner such that the first clip secures the first lid against movement relative to the first component package.

2. The method as described in claim 1 further including the step of:

reciprocating the pick arm between the first and second positions to thereby transfer the second lid from the lid feeder station to the inspection station following the movement of the gripper assembly of the robot arm from the inspection station to the predetermined assembly position.

3. The method as described in claim 2 further including the steps of:

inspecting the second lid at the inspection station; and moving the gripper assembly of the robot arm to the clip feeder station and picking up a second clip during inspection of the second lid.

4. The method as described in claim 3 further including the step of:

indexing the first boat to place a second component package in the predetermined assembly position along the path after the gripper assembly of the robot arm is moved to the clip feeder station to pick up the second clip.

5. The method as described in claim 1 wherein the assembly position is located along the path intermediate of the first and second positions of the conveyor.

6. The method as described in claim 1 further including the steps of:

inspecting the first component package to locate a lid placement position after movement of the gripper assembly of the robot arm from the clip feeder station to the inspection station; and aligning the gripper assembly at the assembly position based on the location of the lid placement position.

7. The method as described in claim 1 further including the steps of:

supporting a plurality of lids in at least first and second stacks on a rotatable carousel of the lid feeder station;

rotating the carousel to place the first stack of lids underlying the pick arm;

removing lids from the first stack until the first stack is empty; and rotating the carousel to place the second stack of lids underlying the pick arm.

8. The method as described in claim 7 further including the steps of:

transferring the carousel from the lid feeder station to a re-loading position after all stacks on the carousel have been depleted.

9. The method as described in claim 1 further including the steps of:

supporting a plurality of clips in at least first and second trays of the clip feeder station;

indexing the first tray to place each clip therein in a predetermined position to be picked up by the gripper assembly of the robot arm;

removing clips from the first tray until the first tray is empty; and indexing the first tray from the clip feeder station to a re-loading position after all clips therein have been picked-up and indexing the second tray into the predetermined position.

10. The method as described in claim 1 further including the step of:

inspecting the first boat after all of the component packages therein have received lids to determine whether the lids have been properly placed.

11. The method as described in claim 10 further including the step of:

conveying a second boat along a path between the first position and the second position after all of the component packages in the first boat have received lids.

12. The method as described in claim 1 wherein the boat includes a body portion and at least one side rail having a plurality of spaced openings therein.

13. The method as described in claim 12 wherein the step of indexing the boat includes the steps of:

counting the spaced openings in the side rail; and when a predetermined number of the openings have been counted, locking the boat into the predetermined assembly position.

14. The method as described in claim 1 wherein the robot arm is an articulated robot arm.

15. The method as described in claim 1 wherein the gripper assembly of the robot arm includes an interchangeable head.

16. A method for automatically placing a lid on a component package and then securing the lid with a clip, wherein at least one component package is supported on a boat that is conveyed along a path, comprising the steps of:

(a) removing a lid from a lid feeder station;

(b) transferring the lid from the lid feeder station to an inspection station;

(c) inspecting the lid to evaluate the integrity of the lid;

(d) picking up a clip during inspection of the lid;

(e) transferring the clip to the inspection station following inspection of the lid;

(f) indexing the boat to place a component package in a predetermined assembly position along the path;

(g) transferring the lid and the clip from the inspection station to the predetermined assembly position; and (h) placing the lid on the component package and securing the clip to the boat in an overlapping manner such that the clip secures the lid against movement relative to the component package.

17. The method as described in claim 16 wherein the boat includes a body portion and at least one side rail having a plurality of spaced openings therein.

18. The method as described in claim 17 wherein the step of indexing the boat includes the steps of:

counting the spaced openings in the side rail; and when a predetermined number of the openings have been counted, locking the boat into the predetermined assembly position.

19. Apparatus for automatically placing a lid on a component package and then securing the lid with a clip, wherein at least one component package is supported on a boat, comprising:

a programmable robot arm having a gripping assembly;

an inspection station;

first conveying means for conveying a first boat along a path between a first position and a second position;

a pick arm for removing a first lid from the lid feeder station;

second conveying means for reciprocating the pick arm between first and second positions to thereby transfer the first lid from the lid feeder station to the inspection station;

first camera means located at the inspection station for inspecting the first lid to evaluate lid integrity and to determine the orientation of the first lid with respect to a predetermined axis;

a rotary actuator arm;

means for reciprocating the rotary actuator arm into contact with a first lid bottom surface following inspection of the first lid and for releasing the gripper arm; and program control means for selectively controlling the robot arm (i) to move the gripper assembly to the clip feeder station and to pick up a first clip during inspection of the first lid, (ii) to move the gripper assembly along with the first clip to the inspection station and to pick up the first lid following inspection of the first lid, and (iii) to move the gripper assembly along with the first clip and the first lid from the inspection station to a predetermined assembly position located along the path.

20. The apparatus as described in claim 19 further including indexing means for indexing the first boat to place a first component package in the predetermined assembly position along the path.

21. The apparatus as described in claim 19 further including:

a lid feeder station.

22. The apparatus as described in claim 19 further including:

a clip feeder station.

23. The apparatus as described in claim 19 wherein the robot arm is an articulated robot arm.

24. The apparatus as described in claim 20 further including second camera means for determining an orientation of the component package in the boat.

25. The apparatus as described in claim 24 further including third camera means for determining whether the lid and clip have been properly placed on the component package.

* * * * *